(12) United States Patent
Begino, III et al.

(10) Patent No.: US 12,158,508 B2
(45) Date of Patent: Dec. 3, 2024

(54) APPARATUS AND METHOD FOR GROUND FAULT MONITORING

(71) Applicant: Advanced Energy Industries, Inc., Denver, CO (US)

(72) Inventors: John Faustino Boqueo Begino, III, Pasig (PH); Nathaniel Franco Neri, Taguig (PH)

(73) Assignee: Advanced Energy Industries, Inc., Denver, CO (US)

( * ) Notice: Subject to any disclaimer, the term of this patent is extended or adjusted under 35 U.S.C. 154(b) by 152 days.

(21) Appl. No.: 18/148,506

(22) Filed: Dec. 30, 2022

(65) Prior Publication Data

US 2024/0219479 A1    Jul. 4, 2024

(51) Int. Cl.
*G01R 31/52* (2020.01)
*G01R 27/18* (2006.01)
*H02H 3/16* (2006.01)

(52) U.S. Cl.
CPC ............ *G01R 31/52* (2020.01); *G01R 27/18* (2013.01); *H02H 3/16* (2013.01)

(58) Field of Classification Search
CPC ........... G01R 31/52; G01R 27/18; H02H 3/16
USPC .......................................................... 324/509
See application file for complete search history.

(56) References Cited

U.S. PATENT DOCUMENTS

| | | | |
|---|---|---|---|
| 10,923,899 B2 | 2/2021 | Hao et al. | |
| 2005/0163308 A1* | 7/2005 | Smith | H04M 3/306 |
| | | | 379/29.03 |
| 2017/0373630 A1* | 12/2017 | Figie | H02P 29/024 |
| 2022/0014013 A1* | 1/2022 | Zhong | G01R 31/42 |

* cited by examiner

*Primary Examiner* — Raul J Rios Russo

(57) ABSTRACT

An apparatus for ground fault monitoring comprises a voltage bus, a high resistance midpoint grounding (HRMG) current limiting circuit, and a ground fault sense circuit. The voltage bus comprises a first and second voltage bus lines. The HRMG current limiting circuit comprises first and HRMG resistors. The HRMG current limiting circuit also comprises a positive sense resistor coupled across the base and emitter terminals of a first transistor and a negative sense resistor coupled across the base and emitter terminals of a second transistor. The ground fault sense circuit is configured to generate a ground fault signal indicative of a ground fault condition existing between the voltage bus and a common ground node.

20 Claims, 6 Drawing Sheets

APPARATUS AND METHOD FOR GROUND FAULT MONITORING

TECHNICAL FIELD

Aspects of the disclosure relate to output power distribution, and more particularly to ground fault protection.

BACKGROUND

High voltage DC power can be used in applications requiring a lot of power. High voltage DC power supplies can provide high voltage such as, for example, 250 Vdc, 360 Vdc, 380 Vdc, 400 Vdc, and the like. Industries incorporating high voltage DC supplies include data centers and telecommunications applications, for example. In the case of a ground fault, current level limiting and shutoff time duration are important design parameters to eliminate or lessen high voltage effects that can be experienced via conduction exposure to a faulted system.

SUMMARY

In accordance with one aspect of the present disclosure, an apparatus for ground fault monitoring comprises a voltage bus, a power supply, a high resistance midpoint grounding (HRMG) current limiting circuit, and a ground fault sense circuit. The voltage bus comprises a first voltage bus line and a second voltage bus line. The power supply comprises a power generation device. The HRMG current limiting circuit comprises a first HRMG resistor coupled with the first voltage bus line, wherein a first current flowing through the first HRMG resistor from the first voltage bus line flows toward a common ground node and comprises a second HRMG resistor coupled with the second voltage bus line, wherein a second current flowing through the second HRMG resistor from the common ground node flows toward the second voltage bus line. The HRMG current limiting circuit also comprises a positive sense resistor and a negative sense resistor. The ground fault sense circuit comprises a first transistor having a base terminal and an emitter terminal, wherein the positive sense resistor is coupled across the base and emitter terminals of the first transistor, and comprises a second transistor having a base terminal and an emitter terminal, wherein the negative sense resistor is coupled across the base and emitter terminals of the second transistor. The ground fault sense circuit is configured to generate a ground fault signal indicative of a ground fault condition existing between the first voltage bus line and the common ground node and between the second voltage bus line and the common ground node.

In accordance with another aspect of the present disclosure, a method of generating a ground fault signal comprises supplying power to a voltage bus, the voltage bus comprises a first voltage bus line and a second voltage bus line, sensing a first current flowing between the first and second voltage bus lines via a negative sense resistor, and sensing a second current flowing between the first and second voltage bus lines via a positive sense resistor. The method further comprises controlling a first transistor into a conduction mode or a non-conduction mode based on the second current, controlling a second transistor into the conduction mode or the non-conduction mode based on the first current, generating a ground fault signal indicative of the absence of any ground fault condition in response to the first and second transistors being in the non-conduction mode, and changing the ground fault signal to indicate a ground fault condition in response to either of the first or the second transistors being in the conduction mode.

Figure 1:
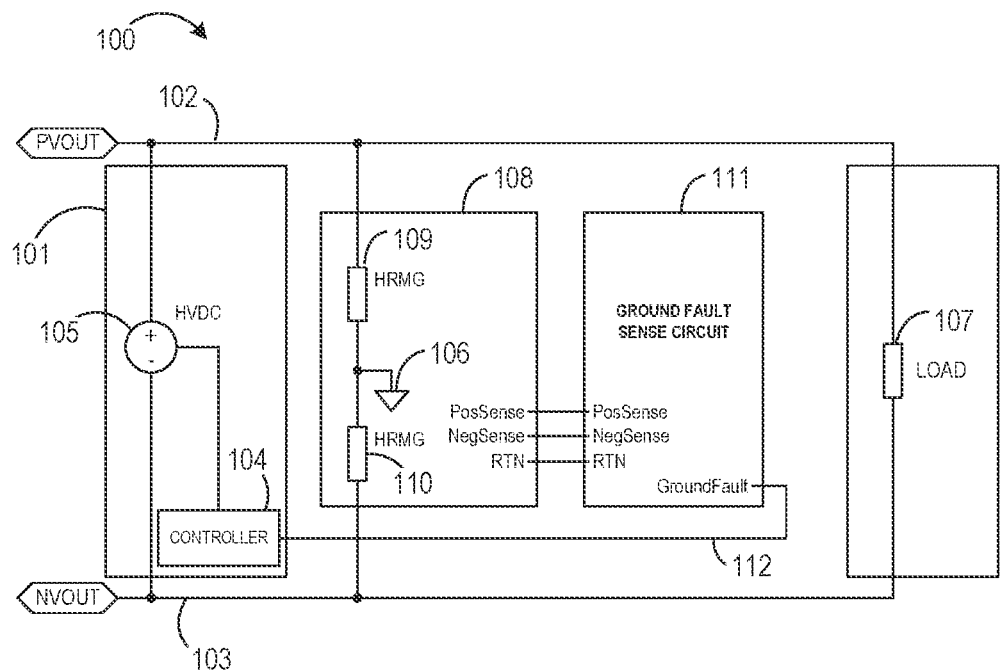
FIG. 1 is a schematic block diagram illustrating a power circuit with ground fault protection according to an example.

While the present disclosure is susceptible to various modifications and alternative forms, specific embodiments thereof have been shown by way of example in the drawings and are herein described in detail. It should be understood, however, that the description herein of specific embodiments is not intended to limit the present disclosure to the particular forms disclosed, but on the contrary, the intention is to cover all modifications, equivalents, and alternatives falling within the spirit and scope of the present disclosure. Note that corresponding reference numerals indicate corresponding parts throughout the several views of the drawings.

DETAILED DESCRIPTION

Examples of the present disclosure will now be described more fully with reference to the accompanying drawings. The following description is merely exemplary in nature and is not intended to limit the present disclosure, application, or uses.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Although the disclosure hereof is detailed and exact to enable those skilled in the art to practice the invention, the physical embodiments herein disclosed merely exemplify the invention which may be embodied in other specific structures. While the preferred embodiment has been described, the details may be changed without departing from the invention, which is defined by the claims.

FIG. 1 is a schematic block diagram illustrating a power circuit 100 with ground fault protection according to an example. The power circuit 100 includes a power supply unit 101 generating a high voltage and supplying the high voltage to a voltage bus 102, 103. For example, a controller 104 coupled to and controlling a voltage converter 105 causes the voltage converter 105 to supply a positive DC voltage to the positive bus line 102 and a negative DC voltage to the negative bus line 102. The positive and negative DC voltages are positive and negative with respect to a common ground 106. The voltage converter 105 can provide DC voltages of 250 Vdc, 360 Vdc, 380 Vdc, 400 Vdc, and the like. The high voltage provided to the voltage bus 102, 103 is supplied to a load 107 coupled thereto.

With such high voltages, circuit protection is provided across the voltage bus 102, 103. A first protection circuit includes a high resistance midpoint grounding (HRMG) current limiting circuit 108. The HRMG current limiting circuit 108 provides current limiting in the event that current flows from the positive voltage bus 102 or the negative voltage bus 103 to the common ground 106, which may occur, for example, via a fault in the power supply 101 or via grounding of the positive or negative voltage bus 102, 103 by a human being. To limit the current, the HRMG current limiting circuit 108 includes a first HRMG resistor 109 between the positive voltage bus 102 and the common ground 106 and includes a second HRMG resistor 110 between the negative voltage bus 103 and the common ground 106.

While the HRMG current limiting circuit 108 functions to limit current in the case of coupling the positive or negative voltage bus 102, 103 to the common ground 106 via a current path outside of the first and second HRMG resistors 109, 110, additional ground fault protection is provided via a ground fault sense circuit 111. The ground fault sense circuit 111 is coupled to the HRMG current limiting circuit 108 to sense a ground fault between the positive voltage bus 102 and the common ground 106 and to sense a ground fault between the negative voltage bus 103 and the common ground 106. The ground fault sense circuit 111 is also coupled with the controller 104 of the power supply 101 to supply a ground fault signal 112 to the controller 104 that indicates the absence or existence of a ground fault. In response to detecting in the ground fault signal 112 that a ground fault exists, the controller 104 may operate to shut down voltage generation by the voltage converter 105 in an example. Embodiments of the ground fault sense circuit 111 are described hereinbelow.

Figure 2:
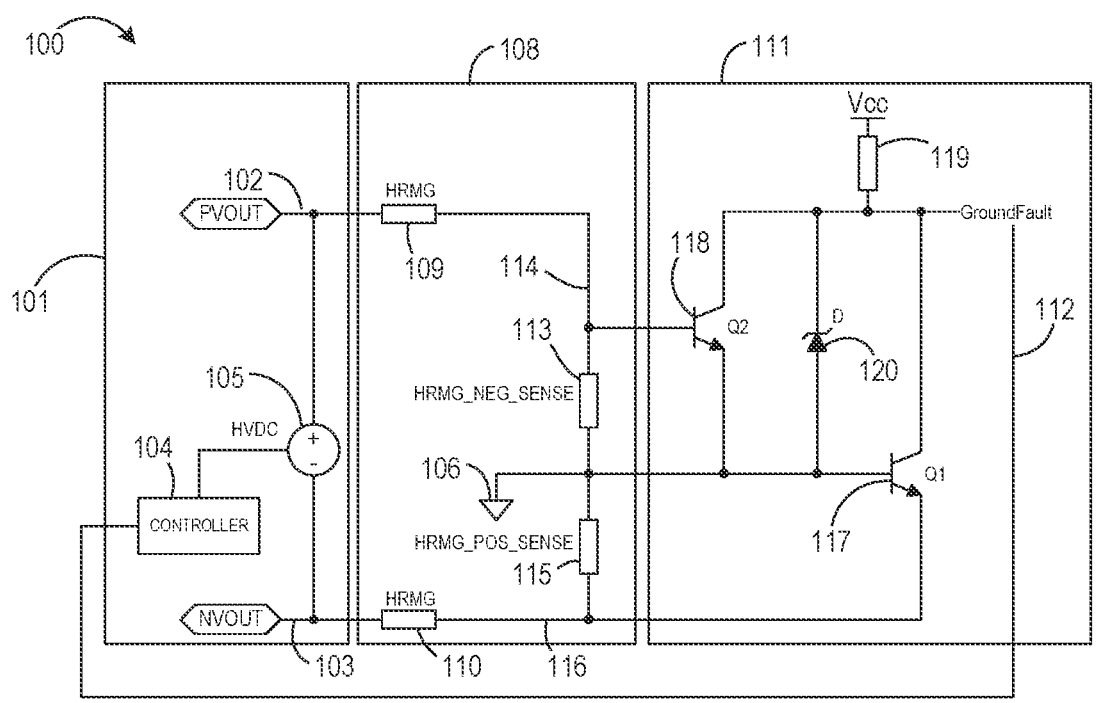
FIG. 2 is a schematic diagram illustrating the ground fault protection of FIG. 1 according to an example.

FIG. 2 is a schematic diagram of the power circuit 100 of FIG. 1 with ground fault protection according to a first example. As shown, the HRMG current limiting circuit 108 includes additional resistors coupled in series with the first and second HRMG resistors 109, 110. A negative sense resistor 113 is serially coupled between the first HRMG resistor 109 and the common ground 106 on the positive voltage side. The node formed between the serially-coupled first HRMG and negative sense resistors 109, 113 will be referred to herein as a negative sense node 114. A positive sense resistor 115 is serially coupled between the second HRMG resistor 110 and the common ground 106 on the negative voltage side. The node formed between the serially-coupled second HRMG and positive sense resistors 110, 115 will be referred to herein as a positive sense node 116.

The ground fault sense circuit 111 includes a first transistor (Q1) 117 having its base terminal coupled with the common ground 106, its emitter terminal coupled with the positive sense node 116, and its collector terminal coupled to the ground fault signal line 112. A second transistor (Q2) 118 has its base terminal coupled with the negative sense node 114, its emitter terminal coupled with the common ground 106, and its collector terminal coupled with the ground fault signal line 112. A pull-up resistor 119 coupled between the ground fault signal line 112 and a positive voltage, $V_{CC}$ (e.g., 5V), provides an active-high logic level signal to the controller 104 in response to both the first and second transistors 117, 118 being simultaneously in their off states (e.g., non-conducting modes).

When no ground fault condition exists between either of the positive or negative voltage buses 102, 103 and the common ground 106, the voltage across the positive and negative sense resistors 115, 113 is below the threshold voltage (e.g., the voltage drop between the base and the emitter terminals) sufficient to cause either respective transistor 117, 118 to transition into its on state (e.g., conducting mode). In one example, a resistance value of the positive and negative sense resistors 115, 113 may be equal and set to a value such that the current that flows therethrough from the positive and negative voltage buses 102, 103 causes the voltage across the sense resistors 115, 113 to fall below the threshold. For example, for a base-emitter voltage drop of 0.7V, the operating voltage across the positive and negative sense resistors 115, 113 may be 0.4V. Accordingly, neither transistor 117, 118 transitions into its on state in the absence of a ground fault condition. As such, the ground fault signal 112 remains at a logic high level when no ground fault condition is in effect.

Circuit response to a positive side ground fault condition will now be described. A positive side ground fault can occur via the creation of an additional current path between the positive voltage bus 102 and the common ground 106. The additional current path may be created via component failure in the power circuit 100 such as the component failure of one or more components of the voltage converter 105 in an example. In another example, a human being may touch the positive voltage bus 102 and create the additional current path to the common ground 106. The additional current path can form a lower resistance path to the common ground 106 than the resistance of the current path formed by the first HRMG resistor 109 and the negative sense resistor 113 (i.e., a positive HRMG current path). Accordingly, current from the positive voltage bus 102 will prioritize the additional current path over the positive HRMG current path. As a result, current flowing in the current path formed by the second HRMG resistor 110 and the positive sense resistor 115 (i.e., a negative HRMG current path) increases, causing the voltage across the positive sense resistor 115 to increase. This increase raises the voltage level at or above the threshold voltage of the first transistor 117, causing the first transistor 117 to turn on and bringing the logic level of the ground fault signal 112 to a logic low value. A Zener diode (D) 120 coupled between the base and emitter terminals of the first transistor 117 helps to maintain the ground fault signal 112 close to 0V (e.g., a diode voltage drop below ground) since the base terminal is coupled to ground and the voltage of the emitter terminal is below 0V (e.g., −0.7V) during the positive side ground fault condition. In response to the current from the positive voltage bus 102 prioritizing the additional current path over the positive HRMG current path, the current in the positive HRMG current path decreases, which further decreases the voltage across the negative sense resistor 113. Thus, the base voltage of the second transistor 118 remains below its threshold voltage, and the second transistor 118 remains in the off state.

Circuit response to a negative side ground fault condition will now be described. A negative side ground fault can occur via the creation of an additional current path between the negative voltage bus 103 and the common ground 106. As with the positive side ground fault condition, the additional current path may be created via component failure in the power circuit 100 such as the component failure of one or more components of the voltage converter 105 in an example. In another example, a human being may touch the negative voltage bus 103 and create the additional current path to the common ground 106. The lower resistance additional current path causes current from the negative voltage bus 103 to prioritize the additional current path over the negative HRMG current path. As a result, current flowing in the current path formed by the first HRMG resistor 109 and the negative sense resistor 113 increases, causing the voltage across the negative sense resistor 113 to increase. This increase raises the voltage level at or above the threshold voltage of the second transistor 118, causing the second transistor 118 to turn on and bringing the logic level of the ground fault signal 112 to a logic low value. In response to the current from the negative voltage bus 103 prioritizing the additional current path over the negative HRMG current path, the current in the negative HRMG current path decreases, which further decreases the voltage across the positive sense resistor 115. Thus, the base voltage of the first transistor 117 remains below its threshold voltage, and the first transistor 117 remains in the off state.

As illustrated in FIG. 2, the controller 104 receives the ground fault signal 112 from the ground fault sense circuit 111. When the ground fault signal 112 is a logic high signal, no positive or negative side ground fault condition is in effect. Accordingly, the controller 104 may control the voltage converter 105 to operate in a normal operating condition according to its control conditions to generate the designed bus voltage to the load (FIG. 1). However, in response to receiving a logic low signal from the ground fault sense circuit 111 via the ground fault signal 112, the controller is configured to disable the supply of high voltage to the voltage bus 102, 103. In one embodiment, the controller 104 may control the voltage converter 105 to cease voltage generation via the voltage converter 105. In another embodiment, the controller 104 may disconnect the supply of the high voltage to the voltage bus 102, 103 while the voltage converter 105 continues to generate high voltage. The control by the controller 104 to cease the supply of high voltage to the voltage bus 102, 103 ceases current flow between both of the positive and negative voltage buses 102, 103 and the common ground 106 through any of the positive or negative HRMG current paths and the additional current path that initiated a ground fault condition.

Figure 3:
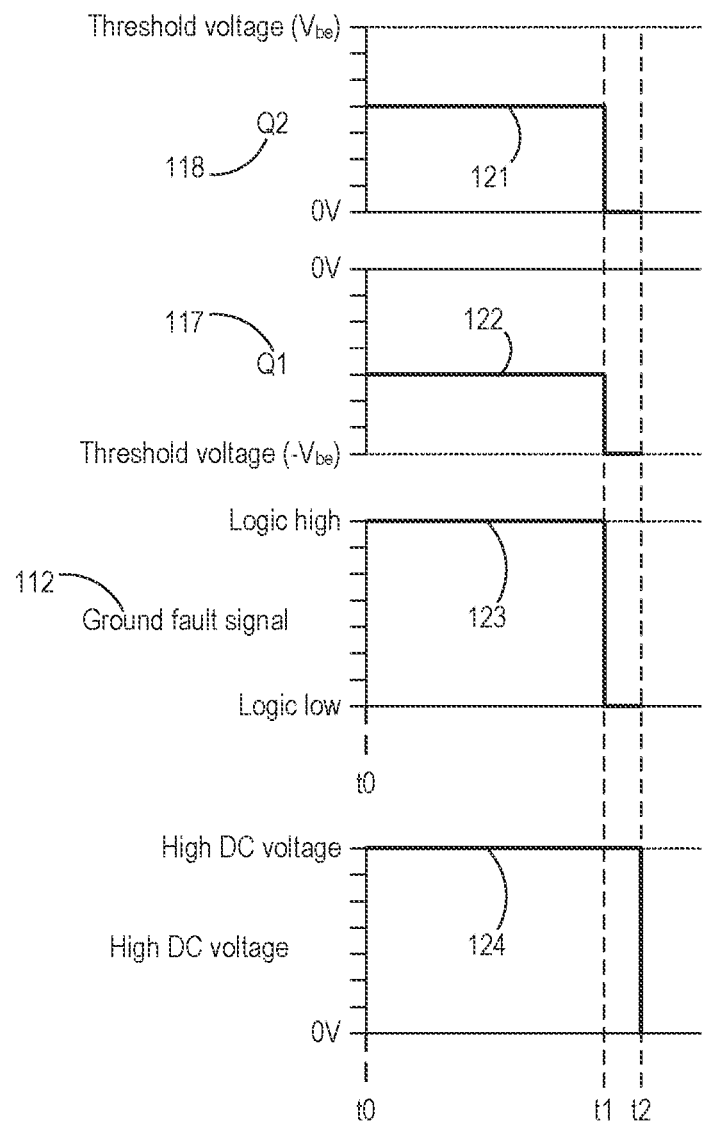
FIG. 3 illustrates examplary waveforms corresponding to the ground fault protection of FIG. 2 according to an example.

FIG. 3 illustrates examplary ideal waveforms showing changes in a ground fault signal in response to activation of the ground fault protection of FIG. 2 according to an example. In a first waveform 121, example voltages of the base terminal of the second transistor (Q2) 118 are illustrated. A second waveform 122 illustrates example voltages of the base terminal of the first transistor (Q1) 117. The example voltages of the ground fault signal 112 are illustrated in a third waveform 123. The operating voltage of the voltage converter 105 is illustrated in a fourth waveform 124.

During a first time period between t0 and t1, no ground fault condition exists. As explained above, when no alternate current path exists between the voltage buses 102, 103 and the common ground 106, the base terminal voltages of the first and second transistors 117, 118 remain below their respective threshold voltages. Thus, neither of the first or second transistors 117, 118 is in a conduction mode. Accordingly, the ground fault signal 112 is at a logic high level during the first time period t0-t1.

At time t1, the positive side ground fault condition described herein is initiated. As explained above, during the positive side ground fault condition, the voltage level at or above the threshold voltage of the first transistor 117 causes the first transistor 117 to turn on and bring the logic level of the ground fault signal 112 to a logic low value. At some time t2 after the start of the positive side ground fault condition at t1, the controller 104 causes the voltage converter 105 to cease delivery of the high DC voltage to the voltage buses 102, 103.

Figure 4:
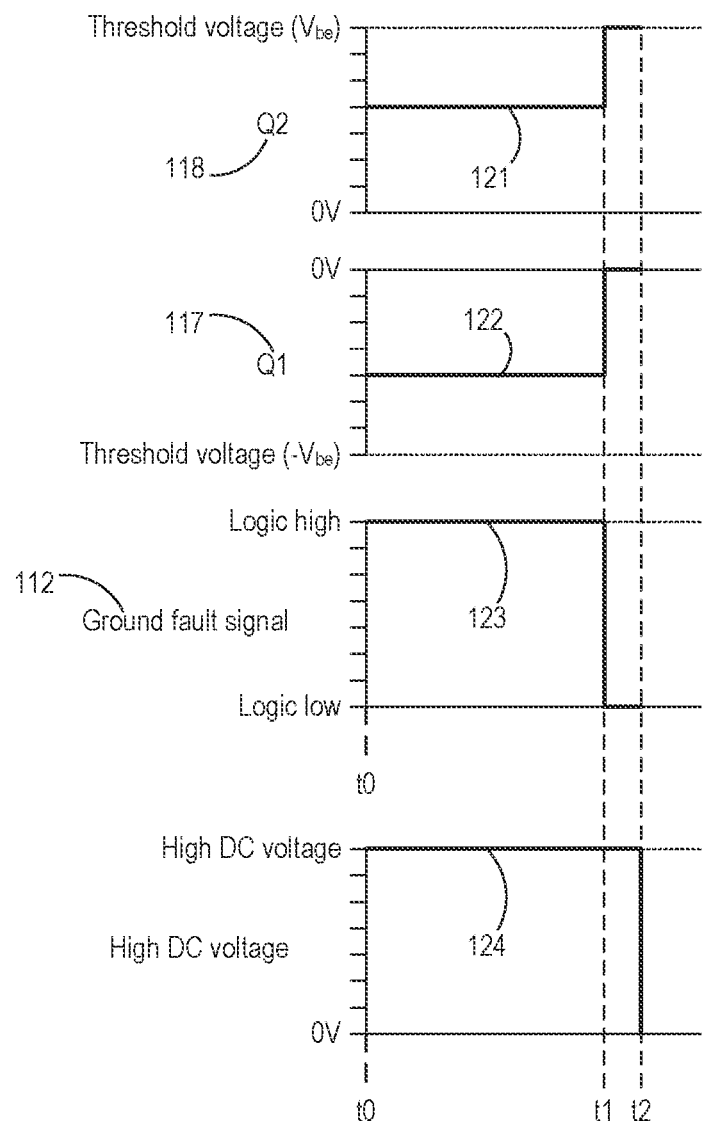
FIG. 4 illustrates examplary waveforms corresponding to the ground fault protection of FIG. 2 according to another example.

FIG. 4 illustrates examplary ideal waveforms showing changes in a ground fault signal in response to activation of the ground fault protection of FIG. 2 according to another example. While FIG. 3 illustrates a positive side ground fault condition, the waveforms in FIG. 4 illustrate a negative side ground fault condition. Similar to FIG. 3, no ground fault condition exists in the first time period between t0 and t1. Thus, neither of the first or second transistors 117, 118 is in a conduction mode, and the ground fault signal 112 is at a logic high level during the first time period t0-t1.

At time t1, the negative side ground fault condition described herein is initiated. As explained above, during the negative side ground fault condition, the voltage level at or above the threshold voltage of the second transistor 118 causes the second transistor 118 to turn on and bring the logic level of the ground fault signal 112 to a logic low value. At some time t2 after the start of the negative side ground fault condition at t1, the controller 104 causes the voltage converter 105 to cease delivery of the high DC voltage to the voltage buses 102, 103.

Figure 5:
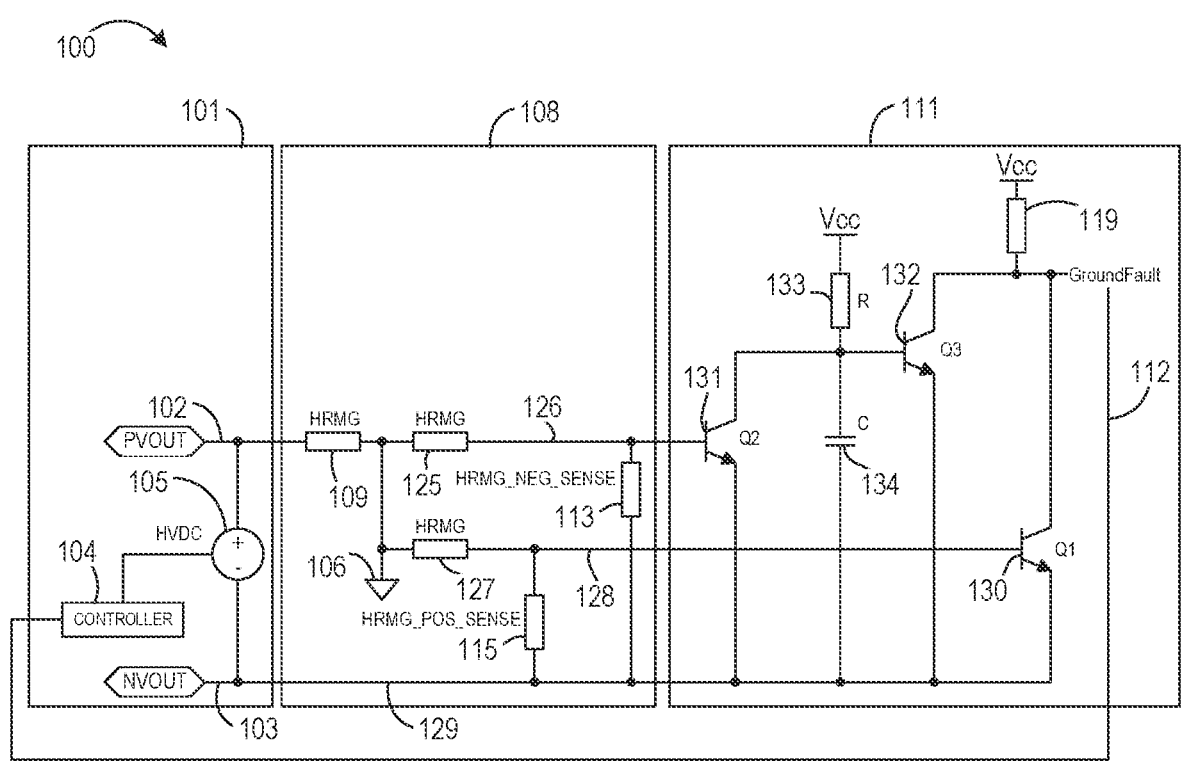
FIG. 5 is a schematic diagram illustrating the ground fault protection of FIG. 1 according to another example.

FIG. 5 is a schematic diagram of the power circuit 100 of FIG. 1 with ground fault protection according to a second example. Components and reference numerals in common with those discussed above with respect to FIG. 2 are illustrated in FIG. 5, and circuit coupling and functionality for the common components may be referenced in the discussion above.

As shown, the HRMG current limiting circuit 108 includes no additional resistor between the first HRMG resistor 109 and the common ground 106. A negative sense node 126 serially couples the negative sense resistor 113 to a third HRMG resistor 125. A positive sense node 128 serially couples the positive sense resistor 115 to a fourth HRMG resistor 127. The negative voltage bus 103 forms a negative HRMG node 129 coupled with each of the positive and negative sense resistors 115, 113.

The ground fault sense circuit 111 includes a first transistor (Q1) 130 having its base terminal coupled with the positive sense node 128, its emitter terminal coupled with the negative HRMG node 129, and its collector terminal coupled to the ground fault signal line 112. A second transistor (Q2) 131 has its base terminal coupled with the negative sense node 126, its emitter terminal coupled with the negative HRMG node 129, and its collector terminal coupled with the base terminal of a third transistor 132. The emitter terminal of the third transistor 132 is coupled with the negative HRMG node 129, and its collector terminal is coupled with the ground fault signal line 112. The collector terminal of the second transistor 131 and the base terminal of the third transistor 132 are further coupled with a second pull-up resistor 133 coupled to a pull-up voltage (e.g., $V_{CC}$) and with a capacitor 134 coupled with the negative HRMG node 129. The pull-up resistor 133 and the capacitor 134 serve as a turn on bias for the third transistor 132 and provide additional filtering. The first pull-up resistor 119 provides a high logic level signal (e.g., with respect to the negative HRMG node 129) to the controller 104 in response to no ground fault condition existing during operation of the power circuit 100.

When no ground fault condition exists between either of the positive or negative voltage buses 102, 103 and the common ground 106, the resistance value of the negative sense resistor 113 is designed to generate a voltage sufficient to meet at least the threshold voltage of the second transistor 131 to cause the second transistor 131 to be in or transition into its on state. As a result of being in its on state, the second transistor 131 causes the voltage supplied to the base terminal of the third transistor 132 to be below the transition voltage of the third transistor 132. Thus, the third transistor 132 is in or transitions into its off state. The resistance value of the positive sense resistor 115 is designed to generate a voltage below the threshold voltage of the first transistor 130 such that the threshold voltage of the first transistor 130 is not met. In this manner, the first transistor 130 is in or transitions into its off state. With both of the first and third transistors 130, 132 being in their off states, the high logic signal supplied through the pull-up resistor 119 is present on the ground fault signal line 112 during the absence of a ground fault condition.

Circuit response to a positive side ground fault condition will now be described. A positive side ground fault can occur as described herein. As a result of being in the positive side ground fault condition, current flowing in the negative HRMG node 129 is increased. Accordingly, the voltage generated across the positive sense resistor 115 is increased to at least the threshold voltage of the first transistor 130 so that the first transistor 130 transitions into its on state. Simultaneously, current flowing through the negative sense resistor 113 is also increased. However, since the threshold voltage of the second transistor 131 was previously met in the absence of the positive side ground fault condition, the second transistor 131 remains in its on state, and no state transition occurs in the second transistor 131. With the transition of the first transistor 130 from its off state into its on state, the voltage level of the ground fault signal 112 changes from a logic high signal to a logic low signal. The controller 104, sensing the logic level change, may react accordingly to control the high voltage supplied to the voltage bus 102, 103 as described above.

Circuit response to a negative side ground fault condition will now be described. A negative side ground fault can occur as described herein. As a result of being in the negative side ground fault condition, current flowing in the negative HRMG node 129 is decreased in favor of flowing through the negative HRMG current path. The positive sense resistor 115, already failing to generate a voltage sufficient to meet the threshold voltage of the first transistor 130, generates an even lower voltage. Thus, the first transistor 130 remains in its off mode that existed during no ground fault condition. The voltage generated by the negative sense resistor 113, however, changes from a value sufficient to meet the threshold voltage of the second transistor 131 to a value lower than the threshold voltage. Therefore, the generated voltage fails to maintain the voltage sufficient to keep the second transistor 131 in its on state. As a result, the second transistor 131 transitions into its off state. With the second transistor 131 in its off state, the pull-up resistor 133 coupling the base terminal of the third transistor 132 to the pull-up voltage (e.g., $V_{CC}$) provides a voltage based on the pull-up voltage that is sufficient to at least meet the threshold voltage of the third transistor 132. Thus, the third transistor 132 transitions into its on state and causes the voltage level of the ground fault signal 112 to change from a logic high signal to a logic low signal. The controller 104 may thus react accordingly to control the high voltage supplied to the voltage bus 102, 103 as described above.

Figure 6:
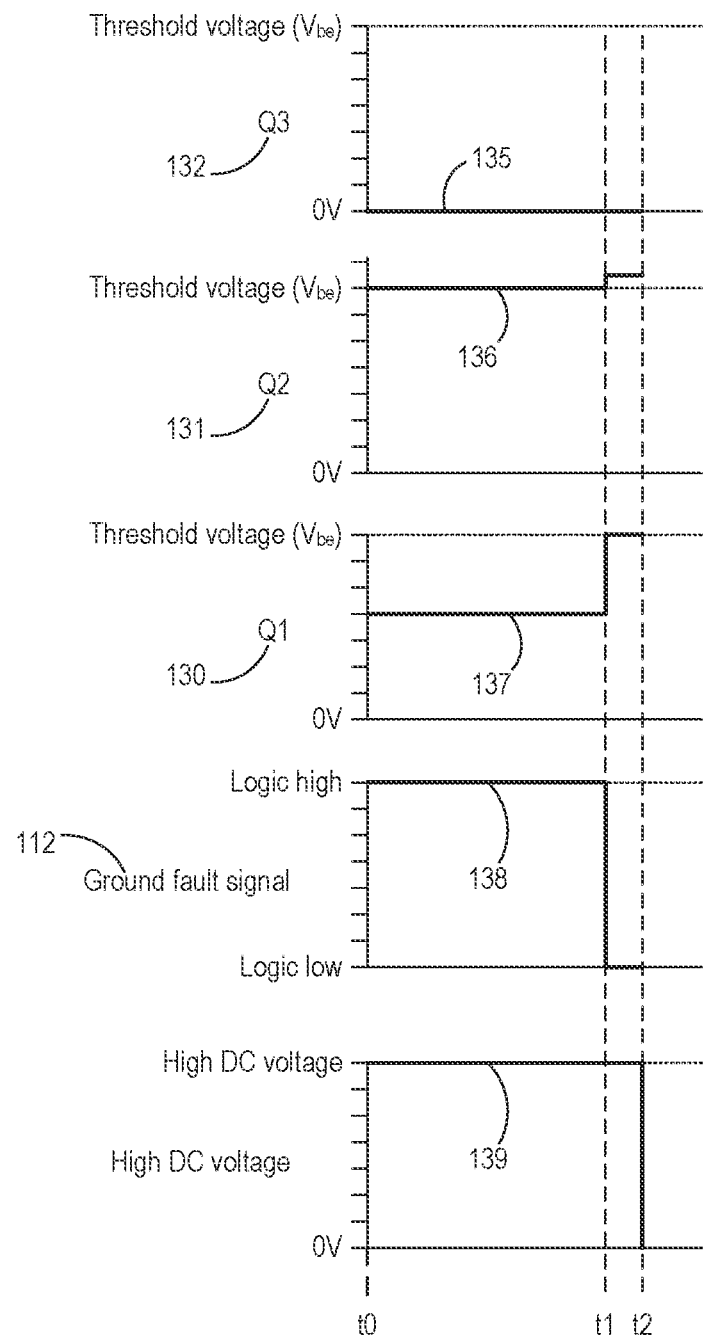
FIG. 6 illustrates examplary waveforms corresponding to the ground fault protection of FIG. 5 according to an example.

FIG. 6 illustrates examplary ideal waveforms showing changes in a ground fault signal in response to activation of the ground fault protection of FIG. 5 according to an example. In a first waveform 135, example voltages of the base terminal of the third transistor (Q3) 132 are illustrated. A second waveform 136 illustrates example voltages of the base terminal of the second transistor (Q2) 131. A third waveform 137 illustrates example voltages of the base terminal of the first transistor (Q1) 130. The example voltages of the ground fault signal 112 are illustrated in a fourth waveform 138. The operating voltage of the voltage converter 105 is illustrated in a fifth waveform 139.

During a first time period between t0 and t1, no ground fault condition exists. As explained above, when no alternate current path exists between the voltage buses 102, 103 and the common ground 106, the base terminal voltages of the first and third transistors 130, 132 remain below their respective threshold voltages. Thus, neither of the first or third transistors 130, 132 is in a conduction mode. Accordingly, the ground fault signal 112 is at a logic high level during the first time period t0-t1.

At time t1, the positive side ground fault condition described herein is initiated. As explained above, during the positive side ground fault condition, the voltage level at or above the threshold voltage of the first transistor 130 causes the first transistor 130 to turn on and bring the logic level of the ground fault signal 112 to a logic low value. At some time t2 after the start of the positive side ground fault condition at t1, the controller 104 causes the voltage converter 105 to cease delivery of the high DC voltage to the voltage buses 102, 103.

Figure 7:
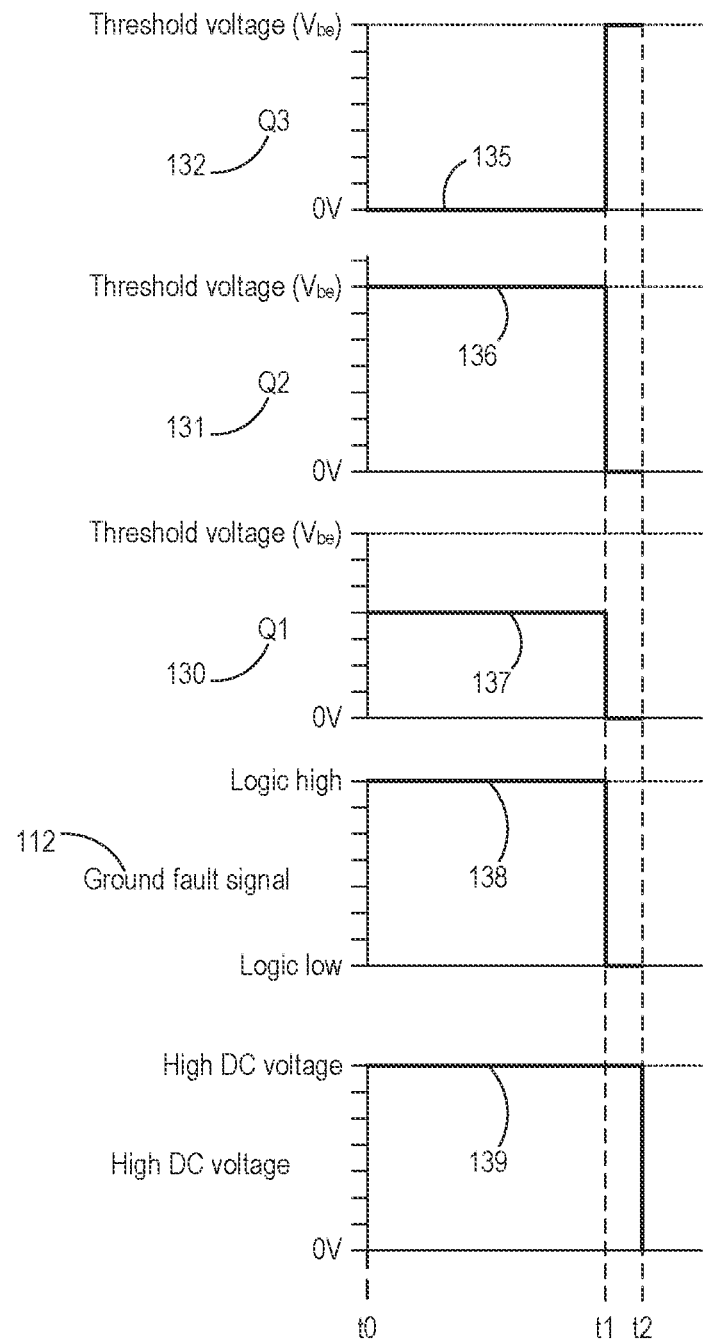
FIG. 7 illustrates examplary waveforms corresponding to the ground fault protection of FIG. 5 according to another example.

FIG. 7 illustrates examplary ideal waveforms showing changes in a ground fault signal in response to activation of the ground fault protection of FIG. 5 according to another example. While FIG. 6 illustrates a positive side ground fault condition, the waveforms in FIG. 7 illustrate a negative side ground fault condition. Similar to FIG. 6, no ground fault condition exists in the first time period between t0 and t1. Thus, neither of the first or third transistors 130, 132 is in a conduction mode, and the ground fault signal 112 is at a logic high level during the first time period t0-t1.

At time t1, the negative side ground fault condition described herein is initiated. As explained above, during the negative side ground fault condition, the voltage level at the base terminal of the second transistor 131 falls below the threshold voltage of the second transistor 131. As a result, the second transistor 131 turns off and allows the voltage provided to the base terminal of the third transistor 132 to meet the threshold value of the third transistor 132, which causes the third transistor 132 to turn on and bring the logic level of the ground fault signal 112 to a logic low value. At some time t2 after the start of the negative side ground fault condition at t1, the controller 104 causes the voltage converter 105 to cease delivery of the high DC voltage to the voltage buses 102, 103.

Embodiments of the invention provide simple, low cost, and easy to install solutions that integrate with the electrical system of the power circuit 100 to provide intelligent shutdown of power generation and/or supply to the power bus 102, 103 in response to a ground fault condition.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the invention is not to be seen as limited by the foregoing description but is only limited by the scope of the appended claims.

The invention claimed is:

1. An apparatus for ground fault monitoring comprising:
   a voltage bus comprising a first voltage bus line and a second voltage bus line;
   a power supply comprising a power generation device;
   a high resistance midpoint grounding (HRMG) current limiting circuit comprising:
      a first HRMG resistor coupled with the first voltage bus line, wherein a first current flowing through the first HRMG resistor from the first voltage bus line flows toward a common ground node;
      a second HRMG resistor coupled with the second voltage bus line, wherein a second current flowing through the second HRMG resistor from the common ground node flows toward the second voltage bus line;
      a positive sense resistor; and
      a negative sense resistor; and
   a ground fault sense circuit comprising:
      a first transistor having a base terminal and an emitter terminal, wherein the positive sense resistor is coupled across the base and emitter terminals of the first transistor; and
      a second transistor having a base terminal and an emitter terminal, wherein the negative sense resistor is coupled across the base and emitter terminals of the second transistor;
   wherein the ground fault sense circuit is configured to generate a ground fault signal indicative of a ground fault condition existing between the first voltage bus line and the common ground node and between the second voltage bus line and the common ground node.

2. The apparatus of claim 1, wherein the power supply further comprises a controller coupled with the power generation device and configured to control the power generation device to generate and supply a voltage to the voltage bus.

3. The apparatus of claim 2, wherein the controller is further configured to cause the power generation device to cease power generation in response to the ground fault signal indicating a ground fault condition.

4. The apparatus of claim 2, wherein the negative sense resistor is serially coupled between the first HRMG resistor and the common ground node; and
   wherein the positive sense resistor is serially coupled between the second HRMG resistor and the common ground node.

5. The apparatus of claim 4, wherein a collector terminal of the first transistor is coupled to a ground fault signal line;
   wherein a collector terminal of the second transistor is coupled to the ground fault signal line; and
   wherein the ground fault signal line is coupled with the controller to provide the ground fault signal to the controller.

6. The apparatus of claim 5, wherein, in response to a positive ground fault condition, a base-emitter voltage is generated by the positive sense resistor via the second current sufficient to transition the first transistor from a non-conducting mode to a conducting mode; and
   wherein, in response to a negative ground fault condition, a base-emitter voltage is generated by the negative sense resistor via the first current sufficient to transition the second transistor from the non-conducting mode to the conducting mode;
   wherein, in response to the first transistor being in the conducting mode and the second transistor being in the non-conducting mode, the ground fault signal transitions from indicating no ground fault condition to indicating the ground fault condition; and
   wherein, in response to the second transistor being in the conducting mode and the first transistor being in the non-conducting mode, the ground fault signal transitions from indicating no ground fault condition to indicating the ground fault condition.

7. The apparatus of claim 6 further comprising a diode coupled in parallel with the base and collector terminals of the first transistor and coupled in parallel with the collector and emitter terminals of the second transistor.

8. The apparatus of claim 2, wherein the HRMG current limiting circuit further comprises a third HRMG resistor;
   wherein the first HRMG resistor is coupled between the first voltage bus line and the common ground node;
   wherein the second HRMG resistor is serially coupled between the positive sense resistor and the common ground node; and
   wherein the third HRMG resistor is serially coupled between the negative sense resistor and the common ground node.

9. The apparatus of claim 8, wherein a base terminal and an emitter terminal of the first transistor is coupled in parallel with the positive sense resistor;
   wherein a base terminal and an emitter terminal of the second transistor is coupled in parallel with the negative sense resistor; and
   wherein the ground fault sense circuit further comprises a third transistor having a base terminal coupled with a collector terminal of the second transistor and an emitter terminal coupled with the emitter terminal of the second transistor.

10. The apparatus of claim 9, wherein the negative sense resistor is configured to generate a base-emitter voltage sufficient to transition the second transistor into a conducting mode in the absence of a ground fault condition.

11. The apparatus of claim 10, wherein, in response to a positive ground fault condition, a base-emitter voltage is generated by the positive sense resistor sufficient to transition the first transistor from a non-conducting mode to the conducting mode.

12. The apparatus of claim 10, wherein, in response to a negative ground fault condition:
   the base-emitter voltage generated by the negative sense resistor is reduced sufficiently to transition the second transistor from the conducting mode to the non-conducting mode; and
   the third transistor is configured to transition from the non-conducting mode to the conducting mode in response to the second transistor transitioning to the non-conducting mode.

13. The apparatus of claim 12, wherein the collector terminal of the first transistor and the collector terminal of the third transistor are coupled to a ground fault signal line; and
   wherein the ground fault signal line is coupled with the controller to provide the ground fault signal to the controller.

14. A method of generating a ground fault signal comprising:
supplying power to a voltage bus, the voltage bus comprising a first voltage bus line and a second voltage bus line;
sensing a first current flowing between the first and second voltage bus lines via a negative sense resistor;
sensing a second current flowing between the first and second voltage bus lines via a positive sense resistor;
controlling a first transistor into a conduction mode or a non-conduction mode based on the second current;
controlling a second transistor into the conduction mode or the non-conduction mode based on the first current;
generating a ground fault signal indicative of the absence of any ground fault condition in response to the first and second transistors being in the non-conduction mode; and
changing the ground fault signal to indicate a ground fault condition in response to either of the first or the second transistors being in the conduction mode.

15. The method of claim 14, wherein controlling the first transistor into the conduction mode or the non-conduction mode comprises controlling the first transistor into the conduction mode in response to a positive ground fault condition existing between the first voltage bus line and a common ground node between the first and second voltage bus lines; and
wherein controlling the second transistor into the conduction mode or the non-conduction mode comprises controlling the second transistor into the conduction mode in response to a negative ground fault condition existing between the common ground node and the second voltage bus line.

16. The method of claim 15, wherein sensing the first current comprises sensing the first current flowing from the first voltage bus line to the common ground node through the negative sense resistor; and
wherein sensing the second current comprises sensing the second current flowing from the common ground node to the second voltage bus line through the positive sense resistor.

17. The method of claim 15, wherein sensing the first current comprises sensing the first current flowing from the common ground node to the second voltage bus line through the negative sense resistor; and
wherein sensing the second current comprises sensing the second current flowing from the common ground node to the second voltage bus line through the positive sense resistor.

18. The method of claim 17, wherein controlling the second transistor into the conduction mode comprises controlling a third transistor into a non-conduction mode;
wherein the third transistor comprises:
a collector terminal coupled with a base terminal of the second transistor; and
a base terminal and an emitter terminal coupled across the negative sense resistor.

19. The method of claim 14, wherein supplying power to a voltage bus comprises controlling a power supply via a controller to generate the power.

20. The method of claim 19 further comprising controlling the power supply to cease generating the power in response to receiving, by the controller, the ground fault signal indicating the ground fault condition.

* * * * *